United States Patent [19]
Sheriff et al.

[11] Patent Number: 6,117,610
[45] Date of Patent: *Sep. 12, 2000

[54] INFRARED-SENSITIVE DIAZONAPHTHOQUINONE IMAGING COMPOSITION AND ELEMENT CONTAINING NON-BASIC IR ABSORBING MATERIAL AND METHODS OF USE

[75] Inventors: Eugene L. Sheriff, Johnstown; Paul R. West, Ft. Collins; Jeffery A. Gurney, Greeley, all of Colo.; Thap DoMinh, Rochester, N.Y.

[73] Assignee: Kodak Polychrome Graphics LLC, Norwalk, Conn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/907,759

[22] Filed: Aug. 8, 1997

[51] Int. Cl.[7] .................................................. G03F 7/023
[52] U.S. Cl. ........................ 430/190; 430/191; 430/192; 430/193; 430/165
[58] Field of Search .................................. 430/190, 191, 430/192, 165

[56] References Cited

U.S. PATENT DOCUMENTS

| | | | |
|---|---|---|---|
| 2,766,118 | 10/1956 | Sus et al. | 95/7 |
| 2,767,092 | 10/1956 | Schmidt | 95/7 |
| 2,772,972 | 12/1956 | Herrick, Jr. et al. | 96/33 |
| 2,859,112 | 11/1958 | Sus et al. | 96/91 |
| 2,907,665 | 10/1959 | Fraher | 106/49 |
| 3,046,110 | 7/1962 | Schmidt | 96/33 |
| 3,046,111 | 7/1962 | Schmidt | 96/33 |
| 3,046,115 | 7/1962 | Schmidt et al. | 96/33 |
| 3,046,118 | 7/1962 | Schmidt | 96/33 |
| 3,046,119 | 7/1962 | Sus | 96/33 |
| 3,046,120 | 7/1962 | Schmidt et al. | 96/33 |
| 3,046,121 | 7/1962 | Schmidt | 96/33 |
| 3,046,122 | 7/1962 | Sus | 96/33 |
| 3,046,123 | 7/1962 | Sus et al. | 96/33 |
| 3,061,430 | 10/1962 | Uhlig et al. | 96/33 |
| 3,102,809 | 9/1963 | Endermann et al. | 96/33 |
| 3,105,465 | 10/1963 | Peters | 122/37 |
| 3,628,953 | 12/1971 | Brinckman | 96/36.3 |
| 3,635,709 | 1/1972 | Kobayashi | 96/33 |
| 3,645,733 | 2/1972 | Brinckman et al. | 430/325 |
| 3,647,443 | 3/1972 | Rauner et al. | 96/33 |
| 3,837,860 | 9/1974 | Roos | 96/91 D |
| 3,859,099 | 1/1975 | Petropoulos et al. | 96/90 R |
| 3,884,693 | 5/1975 | Bauer et al. | 96/15 |
| 3,891,439 | 6/1975 | Katz et al. | 96/49 |
| 3,902,906 | 9/1975 | Iwama et al. | 96/115 R |
| 3,952,132 | 4/1976 | Kato et al. | 428/341 |
| 4,063,949 | 12/1977 | Uhlig et al. | 96/27 E |
| 4,306,010 | 12/1981 | Uehara et al. | 430/190 |
| 4,306,011 | 12/1981 | Uehara et al. | 430/190 |
| 4,308,368 | 12/1981 | Kubo et al. | 525/504 |
| 4,356,254 | 10/1982 | Takashi et al. | 430/296 |
| 4,493,884 | 1/1985 | Nagano et al. | 430/192 |
| 4,497,888 | 2/1985 | Nishioka et al. | 430/165 |
| 4,529,682 | 7/1985 | Toukhy | 430/190 |
| 4,544,627 | 10/1985 | Takashi et al. | 430/325 |
| 4,576,901 | 3/1986 | Stahlhofen et al. | 430/325 |
| 4,609,615 | 9/1986 | Yamashita et al. | 430/325 |
| 4,684,599 | 8/1987 | DoMinh et al. | 430/270 |
| 4,693,958 | 9/1987 | Schwatrz et al. | 430/302 |
| 4,708,925 | 11/1987 | Newman | 430/270 |
| 4,789,619 | 12/1988 | Ruckert et al. | 430/270 |
| 4,927,741 | 5/1990 | Garth et al. | 430/309 |
| 4,966,798 | 10/1990 | Brosius et al. | 428/64 |
| 5,002,853 | 3/1991 | Aoai et al. | 430/281 |
| 5,085,972 | 2/1992 | Vogel | 430/270 |
| 5,130,223 | 7/1992 | Nishimura et al. | 430/166 |
| 5,145,763 | 9/1992 | Bassett et al. | 430/169 |
| 5,149,613 | 9/1992 | Stahlhofen et al. | 430/296 |
| 5,200,292 | 4/1993 | Shinozaki et al. | 430/296 |
| 5,200,298 | 4/1993 | Takagi et al. | 430/264 |
| 5,202,221 | 4/1993 | Imai et al. | 430/192 |
| 5,208,135 | 5/1993 | Patel et al. | 430/281 |
| 5,227,473 | 7/1993 | Kawamura et al. | 534/557 |
| 5,279,918 | 1/1994 | Nishi et al. | 430/190 |
| 5,340,699 | 8/1994 | Haley et al. | 430/302 |
| 5,351,617 | 10/1994 | Williams et al. | 101/467 |
| 5,368,977 | 11/1994 | Yoda et al. | 430/190 |
| 5,372,907 | 12/1994 | Haley et al. | 430/157 |
| 5,372,915 | 12/1994 | Haley et al. | 430/302 |
| 5,372,917 | 12/1994 | Tsuchida et al. | 430/343 |
| 5,380,622 | 1/1995 | Roser | 430/343 |
| 5,437,952 | 8/1995 | Hirai et al. | 430/83 |
| 5,441,850 | 8/1995 | Marshall et al. | 430/336 |
| 5,466,557 | 11/1995 | Haley et al. | 430/278 |
| 5,491,046 | 2/1996 | DeBoer et al. | 430/302 |
| 5,631,119 | 5/1997 | Shinozaki | 430/326 |
| 5,641,608 | 6/1997 | Grunwald et al. | 430/302 |
| 5,658,708 | 8/1997 | Kondo | 430/288.1 |
| 5,705,308 | 1/1998 | West et al. | 430/165 |
| 5,705,309 | 1/1998 | West et al. | 430/167 |
| 5,705,322 | 1/1998 | West et al. | 430/325 |
| 5,725,994 | 3/1998 | Kondo | 430/270.1 |
| 5,731,123 | 3/1998 | Kawamura et al. | 430/191 |
| 5,741,619 | 4/1998 | Aoshima et al. | 430/175 |
| 5,759,742 | 6/1998 | West et al. | 430/278.1 |
| 5,786,125 | 7/1998 | Tsuchiya et al. | 430/272.1 |
| 5,798,201 | 8/1998 | Inomata et al. | 430/192 |
| 5,840,467 | 11/1998 | Kitatani et al. | 430/302 |
| 5,858,626 | 1/1999 | Sheriff et al. | 430/326 |

FOREIGN PATENT DOCUMENTS

| | | |
|---|---|---|
| 0652483 | 5/1981 | European Pat. Off. . |
| 0 304 313 | 2/1989 | European Pat. Off. . |
| 0 327 998 | 8/1989 | European Pat. Off. . |
| 0 343 986 | 11/1989 | European Pat. Off. . |
| 0 366 590 | 5/1990 | European Pat. Off. . |
| 0 375 838 | 7/1990 | European Pat. Off. . |
| 0 390 038 | 1/1991 | European Pat. Off. . |

(List continued on next page.)

*Primary Examiner*—John S. Chu
*Attorney, Agent, or Firm*—Ratner & Prestia

[57] ABSTRACT

An infrared imaging composition contains two essential components, a non-basic infrared radiation absorbing material (such as carbon black), and a phenolic resin that is either mixed or reacted with an o-diazonaphthoquinone derivative. These compositions are useful in positive-working or negative-working imaging elements such as lithographic printing plates that can be adapted to direct-to-plate imaging procedures.

25 Claims, No Drawings

FOREIGN PATENT DOCUMENTS

| | | |
|---|---|---|
| 0 410 606 | 1/1991 | European Pat. Off. . |
| 0 424 182 | 4/1991 | European Pat. Off. . |
| 0631189 | 6/1991 | European Pat. Off. . |
| 0 458 485 | 11/1991 | European Pat. Off. . |
| 0 517 428 | 12/1992 | European Pat. Off. . |
| 0 519 128 | 12/1992 | European Pat. Off. . |
| 0 519 591 | 12/1992 | European Pat. Off. . |
| 0 534 324 | 3/1993 | European Pat. Off. . |
| 0557138 | 8/1993 | European Pat. Off. . |
| 0 608 983 | 3/1994 | European Pat. Off. . |
| 672954 | 3/1994 | European Pat. Off. . |
| 0 672 954 | 9/1995 | European Pat. Off. . |
| 0 672 954 A2 | 9/1995 | European Pat. Off. . |
| 0 691 575 | 1/1996 | European Pat. Off. . |
| 0 706 899 | 4/1996 | European Pat. Off. . |
| 0 720 057 | 7/1996 | European Pat. Off. . |
| 0780239 | 6/1997 | European Pat. Off. . |
| 0 803 771 | 10/1997 | European Pat. Off. . |
| 0 819 980 | 1/1998 | European Pat. Off. . |
| 0823327 | 2/1998 | European Pat. Off. . |
| 0 839 647 | 5/1998 | European Pat. Off. . |
| 0 864 419 | 9/1998 | European Pat. Off. . |
| 0 867 278 | 9/1998 | European Pat. Off. . |
| 0 894 622 | 2/1999 | European Pat. Off. . |
| 4426820 | 7/1993 | Germany . |
| 44 26 820 | 7/1994 | Germany . |
| 58162389 | 9/1978 | Japan . |
| 61-036750 | 2/1986 | Japan . |
| 62-024241 | 2/1987 | Japan . |
| 58-148792 | 5/1987 | Japan . |
| 02010355 | 1/1990 | Japan . |
| 207013 | 2/1995 | Japan . |
| 07120928 | 5/1995 | Japan . |
| 302722 | 5/1995 | Japan . |
| 9264 | 6/1995 | Japan . |
| 09171254 | 6/1997 | Japan . |
| 1066358 | 4/1967 | United Kingdom . |
| 1170495 | 11/1969 | United Kingdom . |
| 1231789 | 5/1971 | United Kingdom . |
| 1245924 | 9/1971 | United Kingdom . |
| 1546633 | 5/1979 | United Kingdom . |
| 1563829 | 4/1980 | United Kingdom . |
| 2082339 | 8/1980 | United Kingdom . |
| 1603920 | 12/1981 | United Kingdom . |
| 2082339 | 3/1982 | United Kingdom . |
| 1245924 | 7/1994 | United Kingdom . |
| 86/02743 | 5/1986 | WIPO . |
| 93/06528 | 9/1991 | WIPO . |
| 91/19227 | 12/1991 | WIPO . |
| 93/06528 | 4/1993 | WIPO . |
| 96/20429 | 12/1994 | WIPO . |
| 96/02491 | 2/1996 | WIPO . |
| 96/20429 | 7/1996 | WIPO . |
| 9739894 | 10/1997 | WIPO . |

INFRARED-SENSITIVE DIAZONAPHTHOQUINONE IMAGING COMPOSITION AND ELEMENT CONTAINING NON-BASIC IR ABSORBING MATERIAL AND METHODS OF USE

FIELD OF THE INVENTION

This invention relates to an imaging composition and element that are sensitive to infrared radiation. In particular, this invention relates to lithographic printing plates and methods of using them for imaging.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image areas retain the water and repel the ink while the image areas accept the ink and repel the water. The ink on the image areas is then transferred to the surface of a material upon which the image is to be reproduced, such as paper, cloth and other materials. Commonly, the ink is transferred to an intermediate material called the blanket which in turn transfers the ink to the surface of the material upon which the image is to be reproduced.

A widely used type of lithographic printing plate has a light-sensitive coating applied to an aluminum base support. The coating may respond to light by having the portion that is exposed become soluble so that it is removed in the developing process. Such a plate is referred to in the art as a positive-working printing plate. Conversely, when that portion of the coating that is exposed becomes hardened, the plate is referred to as a negative-working plate. In both instances, the image areas remaining are ink-receptive or oleophilic and the non-image areas or background are water-receptive or hydrophilic. The differentiation between image and non-image areas is made in the exposure process where a film is applied to the plate with a vacuum to insure good contact. The plate is then exposed to a light source, a portion of which is composed of UV radiation. In the instance of negative-working plates, the areas on the film corresponding to the image areas are clear, allowing light to harden the image area coating, while the areas on the film corresponding to the non-image areas are black, preventing the light hardening process, so the areas not struck by light can be removed during development. The light-hardened surfaces of a negative-working plate are therefore oleophilic and will accept ink while the non-image areas that have had the coating removed through the action of a developer are desensitized and are therefore hydrophilic.

Various useful printing plates that can be either negative-working or positive-working are described, for example, in GB 2,082,339 (Horsell Graphic Industries), and U.S. Pat. No. 4,927,741 (Garth et al), both of which describe imaging layers containing an o-diazonaphthoquinone and a resole resin, and optionally a novolac resin. Another plate that can be similarly used is described in U.S. Pat. No. 4,708,925 (Newman) wherein the imaging layer comprises a phenolic resin and a radiation-sensitive onium salt. This imaging composition can also be used for the preparation of a direct laser addressable printing plate, that is imaging without the use of a photographic transparency.

Direct digital imaging of offset printing plates is a technology that has assumed importance to the printing industry. The first commercially successful workings of such technology made use of visible light-emitting lasers, specifically argon-ion and frequency doubled Nd:YAG lasers. Printing plates with high photosensitivities are required to achieve acceptable through-put levels using plate-setters equipped with practical visible-light laser sources. Inferior shelf-life, loss in resolution and the inconvenience of handling materials under dim lighting are trade-offs that generally accompany imaging systems exhibiting sufficiently high photosensitivities.

Advances in solid-state laser technology have made high-powered diode lasers attractive light sources for plate-setters. Currently, at least two printing plate technologies have been introduced that can be imaged with laser diodes emitting in the infrared regions, specifically at about 830 nm. One of these is described in EP 573,091 (Agfa) and in several patents and published applications assigned to Presstek, Inc [for example, U.S. Pat. No. 5,353,705 (Lewis et al), U.S. Pat. No. 5,351,617 (Williams et al), U.S. Pat. No. 5,379,698 (Nowak et al), U.S. Pat. No. 5,385,092 (Lewis et al) and U.S. Pat. No. 5,339,737 (Lewis et al)]. This technology relies upon ablation to physically remove the imaging layer from the printing plate. Ablation requires high laser fluences, resulting in lower through-puts and problems with debris after imaging.

A higher speed and cleaner technology is described, for example, in U.S. Pat. No. 5,340,699 (Haley et al), U.S. Pat. No. 5,372,907 (Haley et al), U.S. Pat. No. 5,466,557 (Haley et al) and EP-A-0 672 954 (Eastman Kodak) which uses near-infrared energy to produce acids in an imagewise fashion. These acids catalyze crosslinking of the coating in a post-exposure heating step. Precise temperature control is required in the heating step. The imaging layers in the plates of U.S. Pat. No. 5,372,907 (noted above) comprise a resole resin, a novolac resin, a latent Bronsted acid and an infrared absorbing compound. Other additives, such as various photosensitizers, may also be included.

U.S. Pat. No. 5,631,119 (Shinozaki) describes printing plates that can be imaged in the near infrared at moderate power levels with relatively simple processing requirements. In one embodiment, the printing plate has at least two layers: an imaging layer containing an o-diazonaphthoquinone compound and a basic infrared absorbing dye containing a nitrogen atom, and a protective overcoat containing a water-soluble polymer or silicone polymer. Other plates have a single layer. In all cases, the plates are floodwise exposed with ultraviolet light to convert the o-diazonaphthoquinone to an indenecarboxylic acid, which is then imagewise decarboxylated by means of heat transferred from the infrared absorbing dye. Development with an alkaline solution results in removal of areas not subjected to thermal decarboxylation. The pre-imaging floodwise exposure step, however, is awkward in that it precludes the direct loading of the printing plates into plate-setters. Only negative-working compositions are prepared and imaged using the teaching of this patent.

Thus, there is a need for an imaging composition that can be used in either positive-working or negative-working fashion, that can be easily imaged in the near infrared at moderate power levels, and that can be directly processed after imaging.

SUMMARY OF THE INVENTION

The problems noted above with known imaging compositions and printing plates are overcome with an imaging composition consisting essentially of:

a) (i) a mixture of a phenolic resin and an o-diazonaphthoquinone derivative, (ii) a reaction product of a phenolic resin and an o-diazonaphthoquinone reactive derivative, or (iii) a mixture of (i) and (ii) and b) a non-basic infrared radiation absorbing material having a maximum IR absorption wavelength greater than 700 nm.

This invention also provides an imaging element consisting essentially of a support having thereon an imaging layer consisting essentially of the imaging composition described above.

This invention also provides a method of creating a positive image consisting essentially of the steps of:

A) providing an imaging element as described above,

B) without prior or simultaneous floodwise exposure, imagewise exposing the element with an infrared radiation emitting laser, and C) contacting the element with an aqueous developing solution to remove the imagewise exposed areas of the imaging layer.

This invention also provides a method of creating a negative image consisting essentially of the steps of:

A) providing an imaging element as described above,

B) without prior or simultaneous floodwise exposure, imagewise exposing the element with an infrared radiation emitting laser, C) floodwise exposing the element with actinic radiation, and D) contacting the element with an aqueous developing solution to remove the non-imagewise exposed areas of the imaging layer.

The imaging composition and element of this invention are useful for providing high quality positive or negative images using moderately powered lasers. This makes the element much more convenient to use in plate-setters. The element of this invention also does not need a protective overcoat, thereby eliminating the materials and coating step required for such layers. Moreover, such elements are imagewise exposed with a source of infrared radiation without any prior or simultaneous floodwise exposure to UV or other actinic radiation. If the thermally imaged element is floodwise exposed to actinic radiation prior to development, a negative image can be obtained. Without such step, a positive image can be obtained. Thus, flexibility is provided so the user can obtain either type of image from the same printing plate.

Since the elements of this invention are infrared sensitive, digital imaging information can be conveniently utilized to form continuous or halftone images using the moderately powered laser diodes.

DETAILED DESCRIPTION OF THE INVENTION

As noted above, the imaging composition of this invention contains only two essential components:

a) either (i) a mixture of a phenolic resin and an o-diazonaphthoquinone derivative, (ii) a reaction product of a phenolic resin and an o-diazonaphthoquinone reactive derivative, or (iii) a mixture of (i) and (ii), and b) a non-basic infrared absorbing compound having a maximum IR absorption wavelength greater than 700 nm.

The resins useful in the practice of this invention to form a reaction product with an o-diazonaphthoquinone reactive derivative can be any type of resin that has a suitable reactive group for participating in such a reaction. For example, such resins can have a reactive hydroxy group. The phenolic resins defined below are most preferred, but other resins include copolymers of acrylates and methacrylates with hydroxy-containing acrylates or methacrylates, as described for example in U.S. Pat. No. 3,859,099 (Petropoulos et al), for example, a copolymer of hydroxyethyl methacrylate and methyl methacrylate.

The phenolic resins useful herein are light-stable, water-insoluble, alkali-soluble film-forming resins that have a multiplicity of hydroxy groups either on the backbone of the resin or on pendant groups. The resins typically have a molecular weight of at least 350, and preferably of at least 1000, as determined by gel permeation chromatography. An upper limit of the molecular weight would be readily apparent to one skilled in the art, but practically it is about 100,000. The resins also generally have a pKa of not more than 11 and as low as 7.

As used herein, the term "phenolic resin" includes, but is not limited to, what are known as novolac resins, resole resins and polyvinyl compounds having phenolic hydroxy groups. Novolac resins are preferred. Novolac resins are generally polymers that are produced by the condensation reaction of phenols and an aldehyde, such as formaldehyde, or aldehyde-releasing compound capable of undergoing phenol-aldehyde condensation, in the presence of an acid catalyst. Typical novolac resins include, but are not limited to, phenol-formaldehyde resin, cresol-formaldehyde resin, phenol-cresol-formaldehyde resin, p-t-butylphenol-formaldehyde resin, and pyrogallol-acetone resins. Such compounds are well known and described for example in U.S. Pat. No. 4,308,368 (Kubo et al), U.S. Pat. No. 4,845,008 (Nishioka et al), U.S. Pat. No. 5,437,952 (Hirai et al) and U.S. Pat. No. 5,491,046 (DeBoer et al), U.S. Pat. No. 5,143,816 (Mizutani et al) and GB 1,546,633 (Eastman Kodak). A particularly useful novolac resin is prepared by reacting m-cresol or phenol with formaldehyde using conventional conditions.

Another useful phenolic resin is what is known as a "resole resin" that is a condensation product of bis-phenol A and formaldehyde. One such resin is commercially available as UCAR phenolic resin BKS-5928 from Georgia Pacific Corporation.

Still another useful phenolic resin is a polyvinyl compound having phenolic hydroxyl groups. Such compounds include, but are not limited to, polyhydroxystyrenes and copolymers containing recurring units of a hydroxystyrene, and polymers and copolymers containing recurring units of halogenated hydroxystyrenes. Such polymers are described for example in U.S. Pat. No. 4,845,008 (noted above). Other hydroxy-containing polyvinyl compounds are described in U.S. Pat. No. 4,306,010 (Uehara et al) and U.S. Pat. No. 4,306,011 (Uehara et al) which are prepared by reacting a polyhydric alcohol and an aldehyde or ketone, several of which are described in the patents. Still other useful phenolic resins are described in U.S. Pat. No. 5,368,977 (Yoda et al).

A mixture of the resins described above can be used, but preferably, a single novolac resin is present in the imaging composition of this invention.

When the imaging composition of this invention is formulated as a coating composition in suitable coating solvents, the resin is present in an amount of at least 0.5 weight percent. Preferably, it is present in an amount of from about 1 to about 10 weight percent.

In the dried photosensitive layer of the element of this invention, the resin is the predominant material. Generally, it comprises at least 25 weight percent of the layer, and more preferably, it is from about 60 to about 90 weight percent of the dried layer.

In one embodiment of this invention, a phenolic resin is present in admixture with an o-diazonaphthoquinone derivative. Such compounds comprise an o-diazonaphthoquinone moiety or group attached to a ballasting moiety that has a molecular weight of at least 15, but less than 5000.

The o-diazonaphthoquinone derivatives have at least one o-diazonaphthoquinone moiety or group in the molecule, and which is made more soluble in an alkali solution upon irradiation with actinic light. Such derivatives are prepared from compounds that are well known in the art, including those described, for example in Kosar, *Light-Sensitive System*, John Wiley & Sons Inc., 1965, such as esters or amides with a suitable aromatic polyhydroxy compound or amine. Examples are esters of 2-diazo-1,2-dihydro-1-oxonaphthalenesulfonic acid or carboxylic acid chlorides.

Useful derivatives include, but are not limited to: 2,4-bis(2-diazo-1,2-dihydro-1-oxo-5-naphthalenesulfonyloxy) benzophenone, 2-diazo-1,2-dihydro-1-oxo-5-naphthalenesulfonyloxy-2,2-bis(hydroxyphenyl)propane monoester, the hexahydroxybenzophenone hexaester of 2-diazo-1,2-dihydro-1-oxo-5-naphthalenesulfonic acid, 2,2'-bis(2-diazo-1,2-dihydro-1-oxo-5-naphthalenesulfonyloxy) biphenyl, 2,2',4,4'-tetrakis(2-diazo-1,2-dihydro-1-oxo-5-naphthalenesulfonyloxy)biphenyl, 2,3,4-tris(2-diazo-1,2-dihydro-1-oxo-5-naphthalenesulfonyloxy)benzophenone, 2,4-bis(2-diazo-1,2-dihydro-1-oxo-4-naphthalenesulfonyloxy)benzophenone, 2-diazo- 1,2-dihydro- 1-oxo-4-naphthalenesulfonyloxy-2,2-bis(hydroxyphenyl)propane monoester, the hexahydroxybenzophenone hexaester of 2-diazo-1,2-dihydro-1-oxo-4-naphthalenesulfonic acid, 2,2'-bis(2-diazo-1,2-dihydro- 1-oxo-4-naphthalenesulfonyloxy)biphenyl, 2,2',4,4'-tetrakis(2-diazo-1,2-dihydro-1-oxo-4-naphthalenesulfonyloxy)biphenyl, 2,3,4-tris(2-diazo-1,2-dihydro-1-oxo-4-naphthalenesulfonyloxy)benzophenone, and others known in the art, for example described in U.S. Pat. No. 5,143,816 (noted above).

The dry weight ratio of phenolic resin to o-diazonaphthoquinone derivative in this embodiment is generally at least 0.5:1, and a weight ratio of from about 2:1 to about 6:1 is preferred.

In another and preferred embodiment of this invention, a reaction product of a resin (as described above) and an o-diazonaphthoquinone reactive derivative is used in the imaging composition. Such a derivative has a functional group (such as chloride or reactive imide group) that can react with a suitable reactive group (for example, a hydroxy group) of the resin (such as a phenolic resin) and thereby become part of the resin, rendering the resin sensitive to light. The reactive group can be in the 4- or 5-position of the o-diazonaphthoquinone molecule.

Representative reactive compounds include sulfonic and carboxylic acid, ester or amide derivatives of the o-diazonaphthoquinone moiety. Preferred compounds are the sulfonyl chloride or esters, and the sulfonyl chlorides are most preferred. Reactions with the phenolic resins are well known in the art, being described for example in GB 1,546,633 (noted above), U.S. Pat. No. 4,308,368 (noted above) and U.S. Pat. No. 5,145,763 (Bassett et al). Some reaction products are commercially available.

The amount of o-diazonaphthoquinone moiety in the dried imaging composition is generally at least 5 weight percent, and more preferably from about 15 to about 40 weight percent.

The second essential component of the imaging composition of this invention is a non-basic infrared radiation absorbing material, such as carbon black, a tellurium dye, an oxonol dye, a thiopyrilium dye, a cyanine dye or a squarilium dye, as the predominant (more than 50 weight % of total absorbing compounds) infrared radiation absorbing material (or "IR absorbing compound"), as long as such materials are "non-basic" as defined herein. Preferably no other infrared absorbing material is present. The tellurium dyes and carbon black are preferred and carbon black is most preferred. This IR absorbing material must have a maximum IR absorption wavelength (that is $\lambda_{max}$) greater than 700 nm, preferably from about 750 to about 1400 nm, and more preferably at from about 800 to about 1200 nm. Mixtures of suitable IR absorbing materials can be used if desired.

By one definition, "non-basic" material is meant an IR absorbing material that is incapable of substantially deprotonating indenecarboxylic acids. In particular, the non-basic material does not contain a basic nitrogen atom such as in an amino or imino group, or in a nitrogen-containing heterocyclic ring. For example, the IR absorbing dyes specifically defined in U.S. Pat. No. 5,631,119 (noted above) are excluded from use in the present invention because they contain at least one basic nitrogen atom. More specifically, the IR absorbing compounds of this invention do not contain any of the following moieties:

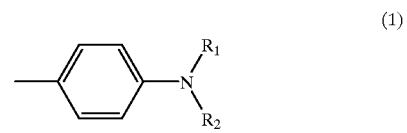

(1)

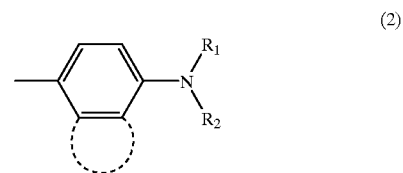

(2)

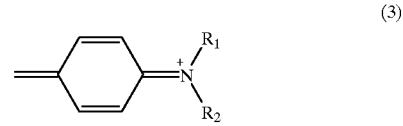

(3)

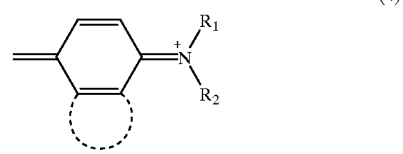

(4)

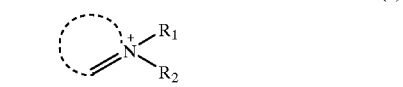

(5)

(6)

(7)

wherein $R_1$ and $R_2$ are independently hydrogen, an alkyl group of any size, an alkoxy group of any size, an aralkyl group of any size or an aryl group of any size.

Representative examples of useful non-basic IR absorbing materials include, but are not limited to, carbon black,
8-[5-[6,7-dihydro-2,4-bis[4-(pentyloxy]phenyl]-5H-1-benzopyran-8-yl]-2,4-pentadienylidene]-5,6,7,8-tetrahydro-2,4-diphenyl-1-benzopyrylium perchlorate,
8-[5-(6,7-dihydro-6-methyl-2,4-diphenyl-5H-1-benzopyran-8-yl)-2,4-pentadienylidene]-5,6,7,8-tetrahydro-6-methyl-2,4-diphenyl- 1 -benzopyrylium perchlorate,
8-[[3-[(6,7-dihydro-2,4-diphenyl-5H-1 -benzopyran-8-yl) methylene]-1-cyclohexen-1-yl]methylene]-5,6,7,8-tetrahydro-2,4-diphenyl-1-benzopyrylium perchlorate,
7-[3-(5,6-dihydro-2,4-diphenylcyclopenta[b]thiopyran-7-yl)-2-propenylidene]-6,7-dihydro-2,4-diphenyl-5H-cyclopenta[b]thiopyrylium perchlorate,
8-[[3-[(6,7-dihydro-2,4-diphenyl-5H-1-benzopyran-8-yl) methylene]-2-methyl-1-cyclohexen-1-yl]methylene]-5,6,7,8-tetrahydro-2,4-diphenyl-1-benzopyryilum perchlorate,
8-[[3-[(6,7-dihydro-2,4-diphenyl-5H- 1-benzopyran-8-yl) methylene]-2-phenyl- 1-cyclohexen-1-yl]methylene]-5,6,7,8-tetrahydro-2,4-diphenyl-1-benzopyrylium tetrafluoroborate,
4-[2-[3-[(2,6-diphenyl-4H-thiopyran-4-ylidene)ethylidene]-2-phenyl-1-cyclohexen-1-yl]ethenyl]-2,6-diphenyl-thiopyrylium perchlorate,
4-[2-[3-[(2.6-diphenyl-4H-thiopyran-4-ylidene)ethylidene]-2-phenyl-1-cyclopenten-1-yl]ethenyl]-2,6-diphenyl-thiopyrylium perchlorate,
4-[2-[2-chloro-3-[(2-phenyl-4H-1-benzothiopyran-4-ylidene)ethylidene]-1-cyclohexen-1-yl]ethenyl]-2-phenyl-1-benzothiopyrylium perchlorate,
dyes disclosed in U.S. Pat. No. 4,508,811, especially 1,3-bis[2,6-di-t-butyl-4H-thiopyran-4-ylidene)methyl]-2,4-dihydroxy-dihydroxide-cyclobutene diylium-bis {inner salt} and 1,3-bis(2,4-di-t-butyl-4H-pyran-4-ylidene)methyl-2,4-dihydroxy-dihydroxide-cylobutene diylium-bis {inner salt},
N,N,N-tributyl-1-butanaminium bis[3,4,6-trichloro-1,2-benzenedithiolato(2-)-S,S']nickelate(2-),
4-[3-[2,6-bis(1,1-dimethylethyl)-4H-tellurin-4-ylidene]-1-propenyl]-2,6-bis(1,1-dimethylethyl)-tellurium tetrafluoroborate,
some of the squarilium and croconylium dyes disclosed in U.S. Pat. No. 5,405,976, especially the dye referred to as "Ir1",
and the oxonol dyes disclosed in Patel, U.S. Pat. No. 5,208,135, incorporated herein by reference.

Many of these materials are commercially available from such sources as Lambda Physik and Exiton.

The amount of IR absorbing material in the dried imaging layer is generally sufficient to provide an optical density of at least 0.05 in the layer, and preferably, an optical density of from about 0.5 to about 2. Generally, this is at least 0.1 weight percent, and preferably from about 1 to about 20 weight percent. Generally, the weight ratio of IR absorbing material to the diazonaphthoquinone moiety of the first essential component is from about 1:0.5 to about 1:50.

Optional, non-essential components of the imaging composition include colorants, sensitizers, stabilizers, exposure indicators, dissolution accelerators, and surfactants in conventional amounts.

Another optional component of the imaging composition when it is used to provide positive images, is a non-photosensitive "dissolution inhibitor compounds". Such compounds have polar functionality that serve as acceptor sites for hydrogen bonding with hydroxy groups on aromatic rings. The acceptor sites are atoms with high electron density, preferably selected from electronegative first row elements. Useful polar groups include keto groups and vinylogous esters. Other groups may also be useful, such as sulfones, sulfoxides, thiones, phosphine oxides, nitriles, imides, amides, thiols, ethers, alcohols, ureas as well as nitroso, azo, azoxy, nitro and halo groups. In general, it is desired that such compounds have an "inhibition factor" of at least 0.5, and preferably at least 5. Inhibition factors for given compounds can be readily measured using the procedure described by Shih et al, *Macromolecules*, Vol. 27, p. 3330 (1994). The inhibition factor is the slope of the line obtained by plotting the log of the development rate as a function of inhibitor concentration in the phenolic resin coating. Development rates are conveniently measured by laser interferometry, as described by Meyerhofer in *IEEE Trans. Electron Devices*, ED-27, 921 (1980).

Representative compounds having the desired properties include aromatic ketones including, but not limited to, xanthone, flavanone, flavone, 2,3-diphenyl-1-indenone, 1'-(2'-acetonaphthonyl)benzoate, $\alpha$- and $\beta$-naphthoflavone, 2,6-diphenyl-4H-pyran-4-one and 2,6-diphenyl-4H-thiopyran-4-one. $\alpha$-Naphthoflavone, 2,6-diphenyl-4H-pyran-4-one and 2,6-diphenyl-4H-thiopyran-4-one are preferred.

The dissolution inhibitors are not themselves actually sensitive to near-IR radiation. Their dissolution inhibition abilities are presumably altered by the localized heating that results from irradiation of the IR absorbing compound. Thus, by "non-photosensitive" is meant that these compounds are not significantly sensitive to actinic radiation having a wavelength above 400 nm, and preferably above 300 nm.

The amount of one or more such compounds in the imaging composition of this invention can vary widely, but generally it is at least about 1 weight percent, based on the total dry composition weight.

The imaging composition is coated out of one or more suitable organic solvents that have no effect on the sensitivity of the composition. Various solvents for this purpose are well known, but acetone and 1-methoxy-2-propanol are preferred. The essential components of the composition are dissolved in the solvents in suitable proportions.

Suitable conditions for drying the imaging composition involve heating for a period of time of from about 0.5 to about 5 minutes at a temperature in the range of from about 20 to about 150° C.

To form an imaging element of this invention, the imaging composition is applied (usually by coating techniques) onto a suitable support, such as a metal, polymeric film, ceramics or polymeric-coated paper using conventional procedures and equipment. Suitable metals include aluminum, zinc or steel, but preferably, the metal is aluminum. A most preferred support is an electrochemically grained and sulfuric acid anodized aluminum sheet that has been further treated with an acrylamide-vinylphosphonic acid copolymer according to the teaching in U.S. Pat. No. 5,368,974 (Walls et al). Such elements are generally known as lithographic printing plates, but other useful elements include printed circuit boards.

The thickness of the resulting imaging layer, after drying, on the support can vary widely, but typically it is in the range of from about 0.5 to about 2 mm, and preferably from about 1 to about 1.5 mm.

No other essential layers are provided on the element of this invention. In particular, there is no need for protective or other type of layer over the imaging layer which is the outermost layer, but a protective layer can be used if desired.

Optional, but not preferred subbing or antihalation layers can be disposed under the imaging layer, or on the backside of the support (such as when the support is a transparent polymeric film).

The elements of this invention are uniquely adapted for "direct-to-plate" imaging applications. Such systems utilize digitized image formation, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed imaging element of this invention. Thus, no exposed and processed films are needed for imaging of the elements, as in the conventional lithographic imaging processes.

Laser imaging can be carried out using any moderate or high-intensity laser diode writing device. Specifically, a laser printing apparatus is provided that includes a mechanism for scanning the write beam across the element to generate an image without ablation. The intensity of the write beam generated at the laser diode source at the element is at least 10 milliwatts/$\mu m^2$ (preferably from 10–1000 milliwatts/$\mu m^2$). During operation, the element to be exposed is placed in the retaining mechanism of the writing device and the write beam is scanned across the element to generate an image.

Following laser imaging, to provide a positive image the printing plate is developed in an alkaline developer solution until the image areas are removed. Development can be carried out under conventional conditions for from about 30 to about 120 seconds. One useful aqueous alkaline developer solution is a silicate solution containing an alkali metal silicate or metasilicate. Such a developer solution can be obtained from Eastman Kodak Company as KODAK PRODUCTION SERIES Machine Developer/Positive.

To provide negative images, the laser imaged printing plate is floodwise exposed using any suitable source of actinic radiation (visible or UV light emitters) for a suitable time. The plate is then developed as described above to remove non-image areas to provide the desired negative image.

After development, the element is usually treated with a finisher such as gum arabic. However, after imaging, the plate is subjected to no other essential steps, except those just described. Thus, no post-imaging bake step is carried out. A post-development baking step can be used, if desired, to increase run length of the plate.

The following examples are provided to illustrate the practice of this invention, and not to limit it in any manner. Unless otherwise noted, all percentages are by weight.

EXAMPLE 1

An imaging coating formulation was prepared as follows:

| COMPONENT | GRAMS |
| --- | --- |
| Cresol-formaldehyde novolac resin | 4.940 |
| 2,4-Bis(2-diazo-1,2-dihydro-1-oxo-5-naphthalenesulfonyloxy)benzophenone | 0.833 |

-continued

| COMPONENT | GRAMS |
| --- | --- |
| Carbon black | 0.033 |
| 1-Methoxy-2-propanol solvent | 82.888 |
| Acetone | 11.195 |
| CG-21-1005 | 0.100 |
| BYK-307 | 0.011 |

CG 21-1005 is a dye available from Ciba-Geigy.
BYK-307 is a polyether-modified polydimethylsiloxane available from BYK-Chemie.

This formulation was applied to give a dry coating weight of about 1 g/m$^2$ onto electrochemically grained and sulfuric acid anodized aluminum sheets that had been further treated with an acrylamide-vinylphosphonic acid copolymer (according to U.S. Pat. No. 5,368,974) to form an unexposed lithographic printing plate.

The plate was imaged on a Gerber 42/T platesetter and then processed with KODAK PRODUCTION SERIES Machine Developer/Positive to provide a well-defined positive image. This example shows that the present invention can provide a useful positive image at low concentrations of IR absorbing material.

EXAMPLE 2

Two imaging coating formulations were prepared with the following components:

| COMPONENT | Control A | Example 2 |
| --- | --- | --- |
| m-Cresol-formaldehyde novolac resin derivatized with 2-diazo-1,2-dihydro-1-oxo-5-naphthalenesulfonyl chloride | 4.338 | 4.338 |
| 2-{2-[2-chloro-3-((1,3-dihdyro-1,1,3-trimethyl-2H-benz[e]indol-2-ylidene)ethylidene)-1-cyclohexene-1-yl]ethenyl}-1,1,3-trimethyl-1H-benz[e]indolium, salt with 4-methylbenzenesulfonic acid | 0.651 | 0 |
| Carbon black | 0 | 0.651 |
| 1-Methoxy-2-propanol solvent | 94.892 | 85.000 |
| CG-21-1005 | 0.108 | 0 |
| BYK-307 | 0.011 | 0.011 |

CG 21-1005 is a dye available from Ciba-Geigy.
BYK-307 is a polyether-modified polydimethylsiloxane available from BYK-Chemie.

These two formulations were coated to form lithographic printing plates as described in Example 1. The Example 2 plate was overcoated with an aqueous solution of poly(vinyl alcohol) to a dry coating coverage of about 2 g/m$^2$.

The Control A plate was imaged with a 500 mW diode laser emitting a modulated pulse centered at 830 nm, followed by a 15 unit floodwise exposure with an Olec exposure unit in the high intensity mode and processed as described in Example 1. The Control A plate produced a negative image.

One half of the Example 2 plate was floodwise exposed as noted above. Both halves of the plate were then imaged with the IR laser as described above. The half of the plate that had not been previously floodwise exposed was then floodwise exposed. The plate provided positive images on both halves of the plate after processing as described above. This example demonstrates that substitution of the "basic" IR absorbing material in Control A with carbon black in Example 2 transforms the IR sensitive coating from one that is negative-working to one that is positive-working. Moreover, Example 2 remained positive-working whether floodwise exposed before or after IR laser imaging, and is positive-working. Moreover, additional layers do not affect the imaging properties.

EXAMPLES 3–6

Four imaging compositions and plates of the present invention were prepared using the following components:

| COMPONENT | Example 3 (grams) | Example 4 (grams) | Example 5 (grams) | Example 6 (grams) |
|---|---|---|---|---|
| Cresol-formaldehyde novolac resin | 4.620 | 4.620 | 4.620 | 4.620 |
| 2,4-Bis(2-diazo-1,2-dihydro-1-oxo-5-naphthalenesulfonyloxy)benzo-phenone | 1.154 | 1.154 | 1.154 | 1.154 |
| Carbon black | 0.108 | 0.217 | 0.434 | 0.868 |
| 1-Methoxy-2-propanol solvent | 88.118 | 88.009 | 87.792 | 87.358 |
| Acetone | 5.881 | 5.881 | 5.881 | 5.881 |
| CG-21-1005 | 0.108 | 0.108 | 0.108 | 0.108 |
| BYK-307 | 0.011 | 0.011 | 0.011 | 0.011 |

CG 21-1005 is a dye available from Ciba-Geigy.
BYK-307 is a polyether-modified polydimethylsiloxane available from BYK-Chemie.

Each formulation was used to prepare a plate as described in Example 1, and the plates were imaged using a Gerber 42/T platesetter at 1064 nm and also on a CREO 3244 Thermal platesetter at 830 nm. The plates were then developed as described in Example 1 to produce positive images. These examples illustrate that the present invention provides positive images over a wide range of IR absorbing material, and that the plates can be imaged over a broad portion of the near infrared region of the electromagnetic spectrum.

EXAMPLE 7

An imaging coating formulation was prepared as follows:

| COMPONENT | GRAMS |
|---|---|
| m-Cresol-formaldehyde novolac resin derivatized with 2-diazo-1,2-dihydro-1-oxo-5-naphthalenesulfonyl chloride | 4.442 |
| 2,4-Bis(1,2-naphthoquinone-2-diazido-5-sulfonyloxy)benzo-phenone | 0.774 |
| Carbon black | 0.347 |
| 1-Methoxy-2-propanol solvent | 94.318 |
| CG-21-1005 | 0.108 |
| BYK-307 | 0.011 |

CG 21-1005 is a dye available from Ciba-Geigy.
BYK-307 is a polyether-modified polydimethylsiloxane available from BYK-Chemie.

This formulation was coated as described in Example 1, given a series of exposures on a Gerber 42/T platesetter, and then developed as described in Example 1. From a graphical plot of remaining thickness versus imaging dose, it was determined that the minimum imaging dose to clear for the positive-working was 300 mJ/cm$^2$.

EXAMPLE 8

An imaging coating formulation was prepared as follows:

| COMPONENT | GRAMS |
|---|---|
| m-Cresol-formaldehyde novolac resin derivatized with 2-diazo-1,2-dihydro-1-oxo-5-naphthalenesulfonyl chloride | 4.854 |
| 4,6-Dimethyl-N,N'-diphenyl-1,3-benzenesulfonamide | 0.095 |
| alpha-Naphthoflavone | 0.273 |
| Carbon black | 0.350 |
| 1-Methoxy-2-propanol solvent | 94.307 |
| CG-21-1005 | 0.110 |
| BYK-307 | 0.011 |

CG 21-1005 is a dye available from Ciba-Geigy.
BYK-307 is a polyether-modified polydimethylsiloxane available from BYK-Chemie.

This formulation was coated as described in Example 1, and imaged and developed as described in Example 7. From a graphical plot of remaining thickness versus imaging dose, it was determined that the minimum imaging dose to clear for the positive-working was 195 mg/cm$^2$. This example demonstrates the use of a non-photosensitive dissolution inhibitor in the imaging composition.

EXAMPLE 9

An imaging coating formulation was prepared as follows:

| COMPONENT | GRAMS |
|---|---|
| m-Cresol-formaldehyde novolac resin derivatized with 2-diazo-1,2-dihydro-1-oxo-5-naphthalenesulfonyl chloride | 4.472 |
| 2,4-Bis(1,2-naphthoquinone-2-diazido-5-sulfonyloxy)benzo-phenone | 0.490 |
| FC-430 | 0.013 |
| Carbon black | 0.350 |
| 1-Methoxy-2-propanol solvent | 94.409 |
| CG-21-1005 | 0.109 |
| BYK-307 | 0.026 |

CG 21-1005 is a dye available from Ciba-Geigy.
BYK-307 is a polyether-modified polydimethylsiloxane available from BYK-Chemie.
FC-430 is a fluorinated surfactant available from 3M.

This formulation was coated at a coverage of about 1.4 g/m$^2$, imaged and developed as described in Example 1 to produce a strong visible positive image. The plate was then mounted on a commercially available printing press and successfully used to print the image on paper.

EXAMPLE 10

The following imaging composition was prepared and coated on aluminum substrates as described in Example 1:

| COMPONENT | GRAMS |
|---|---|
| m-Cresol-formaldehyde novolac resin derivatized with 2-diazo-1,2-dihydro-1-oxo-5-naphthalenesulfonyl chloride | 3.934 |
| Carbon black | 0.437 |
| 1-Methoxy-2-propanol solvent | 95.51 |
| CG-21-1005 | 0.108 |
| BYK-307 | 0.011 |

CG 21-1005 is a dye available from Ciba-Geigy.
BYK-307 is a polyether-modified polydimethylsiloxane available from BYK-Chemie.

The resulting plates were imagewise exposed using a commercially available CREO 3244 Thermal platesetter at 11 watts, 64 rpm, and then subjected to floodwise exposure using a commercially available Olec exposure apparatus at several exposure levels, 5, 10, 20 and 30 exposure units.

Following exposure, the plate was developed using a 2:1 dilution of a developer solution similar to that described in Example 1. It was observed that the plate exposed at the 30 unit exposure level provided a definite negative image, while the plate exposed at the 5 unit exposure level provided a positive image. The plates exposed at the intermediate levels exhibited poor image discrimination. It is believed that, in view of this teaching, imaging compositions could of this invention can be formulated to be either positive- or negative-working. Preferably, however, the compositions are more readily formulated to be positive-working.

EXAMPLE 11

An imaging coating formulation was prepared as follows:

| COMPONENT | GRAMS |
|---|---|
| 2,4-Bis(2-diazo-1,2-dihydro-1-oxo-5-naphthalenesulfonyloxy)benzophenone | 0.75 |
| m-Cresol-formaldehyde novolac resin derivatized with 2-diazo-1,2-dihydro-1-oxo-5-naphthalenesulfonyl chloride | 4.31 |
| 4,6-Dimethyl-N,N'-diphenyl-1,3-benzenesulfonamide | 0.43 |
| Tellurium dye as the infrared absorbing compound - see below | 0.52 |
| Acetone | 93.39 |
| CG-21-1005 | 1.01 |
| BYK-307 | 0.13 |

CG 21-1005 is a dye available from Ciba-Geigy.
BYK-307 is a polyether-modified polydimethylsiloxane available from BYK-Chemie.

The tellurium dye used in this formulation has the structure:

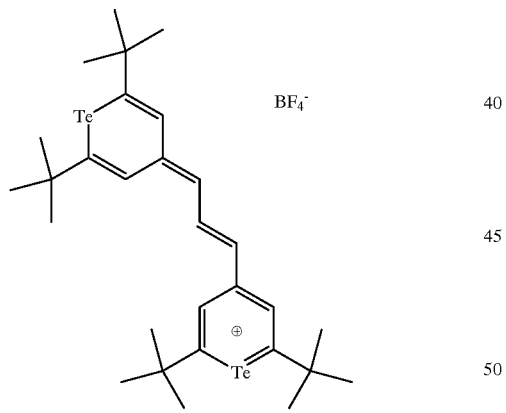

The formulation was coated as in Example 1 to give a dry coating weight of about 1.1 g/m². The resulting plate was dried for 3 minutes at 82° C., and imagewise exposed to a diode laser (830 nm) at a dose of 350–600 mJ/cm². The plate was then developed as described in Example 1 to provide a very good positive image.

EXAMPLE 12

Example 11 was repeated using a tellurium dye having the same structure but with a chloride anion. The resulting IR-imaged and developed printing plate provided a desired positive image.

The invention has been described in detail with particular reference to preferred embodiments thereof, but it will be understood that variations and modifications can be effected within the spirit and scope of the invention.

We claim:

1. An imaging composition consisting essentially of:
   a) (i) a mixture of a phenolic resin and an o-diazonaphthoquinone derivative,
      (ii) a reaction product of a phenolic resin and an o-diazonaphthoquinone reactive derivative, or
      (iii) a mixture of (i) and (ii),
   b) a non-basic infrared absorbing material that has a maximum infrared absorption wavelength greater than 700 nm, and
   c) a non-photosensitive dissolution inhibitor compound; in which the non-photosensitive dissolution inhibitor compound is not significantly sensitive to actinic radiation having a wavelength above 400 nm.

2. The composition of claim 1 wherein said non-basic infrared radiation absorbing material does not include any of the following moieties:

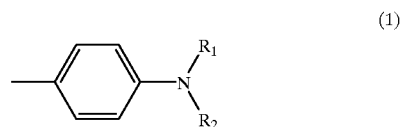
(1)

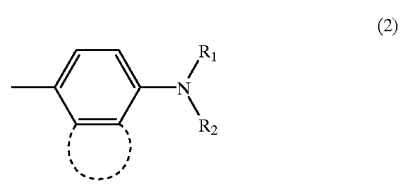
(2)

(3)

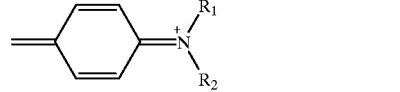
(4)

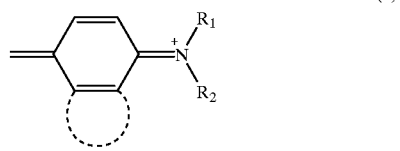
(5)

(6)

(7)

wherein $R_1$ and $R_2$ are independently hydrogen, an alkyl group, an alkoxy group, an aralkyl group or an aryl group.

3. The composition of claim 1 wherein said non-basic infrared radiation absorbing material is carbon black, a tellurium dye, an oxonol dye, a thiopyrilium dye, a cyanine dye or a squarilium dye.

4. The composition of claim 1 in which component a) comprises component (ii), and the phenolic resin is a novolac resin.

5. The composition of claim 1 in which component a) comprises component (ii), and the o-diazonaphthoquinone reactive derivative is a sulfonic acid or a carboxylic acid ester of o-diazonaphthoquinone.

6. The composition of claim 1 wherein said o-diazonaphthoquinone derivative is 2,4-bis(2-diazo-1,2-dihydro-1-oxo-5-naphthalenesulfonyloxy)benzophenone, 2-diazo-1,2-dihydro-1-oxo-5-naphthalenesulfonyloxy-2,2-bis(hydroxyphenyl)propane monoester, the hexahydroxybenzophenone hexaester of 2-diazo-1,2-dihydro-1-oxo-5-naphthalenesulfonic acid, 2,2'-bis(2-diazo-1,2-dihydro-1-oxo-5-naphthalenesulfonyloxy)biphenyl, 2,2',4,4'-tetrakis(2-diazo-1,2-dihydro-1-oxo-5-naphthalenesulfonyloxy)biphenyl, 2,3,4-tris(2-diazo-1,2-dihydro-1-oxo-5-naphthalenesulfonyloxy)benzophenone, 2,4-bis(2-diazo-1,2-dihydro-1-oxo-4-naphthalenesulfonyloxy)benzophenone, 2-diazo-1,2-dihydro-1-oxo-4-naphthalenesulfonyloxy-2,2-bis(hydroxyphenyl)propane monoester, the hexahydroxybenzophenone hexaester of 2-diazo-1,2-dihydro-1-oxo-4-naphthalenesulfonic acid, 2,2'-bis(2-diazo-1,2-dihydro-1-oxo-4-naphthalenesulfonyloxy)biphenyl, 2,2',4,4'-tetrakis(2-diazo-1,2-dihydro-1-oxo-4-naphthalenesulfonyloxy)biphenyl or 2,3,4-tris(2-diazo-1,2-dihydro-1-oxo-4-naphthalenesulfonyloxy)benzophenone.

7. The composition of claim 1 in which the non-basic infrared absorbing material is present in an amount sufficient to provide an optical density of from about 0.1 to about 2.

8. The composition of claim 1 in which the weight ratio of the infrared absorbing material to the diazonaphthoquinone moiety of a) is from about 1:0.5 to about 1:50.

9. An imaging composition consisting essentially of:
   a) (i) a mixture of a phenolic resin and an o-diazonaphthoquinone derivative,
      (ii) a reaction product of a phenolic resin and an o-diazonaphthoquinone reactive derivative, or
      (iii) a mixture of (i) and (ii),
   b) carbon black, and
   c) at least about 1 weight percent of a non-photosensitive dissolution inhibitor compound, based on the total dry composition weight;
   in which:
   the non-photosensitive dissolution inhibitor compound is not significantly sensitive to actinic radiation having a wavelength above 400 nm;
   the non-photosensitive dissolution inhibitor compound is an aromatic ketone; and
   the ratio of carbon black to the o-diazonaphthoquinone moiety of a) is from about 1:0.5 to about 1:50.

10. An imaging element comprising a support having thereon an imaging layer consisting essentially of:
    a) (i) a mixture of a phenolic resin and an o-diazonaphthoquinone derivative,
       (ii) a reaction product of a phenolic resin and an o-diazonaphthoquinone reactive derivative, or
       (iii) a mixture of (i) and (ii),
    b) a non-basic infrared absorbing material that has a maximum infrared absorption wavelength greater than 700 nm, and
    c) a non-photosensitive dissolution inhibitor compound; in which the non-photosensitive dissolution inhibitor compound is not significantly sensitive to actinic radiation having a wavelength above 400 nm.

11. The element of claim 10 wherein said non-basic infrared radiation absorbing material does not include any of the following moieties:

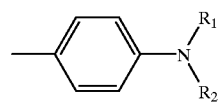

(1)

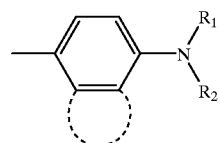

(2)

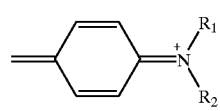

(3)

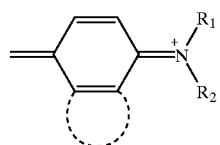

(4)

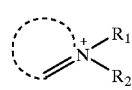

(5)

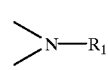

(6)

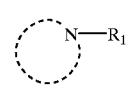

(7)

wherein $R_1$ and $R_2$ are independently hydrogen, an alkyl group, an alkoxy group, an aralkyl group or an aryl group.

12. The element of claim 10 wherein said non-basic infrared radiation absorbing material is carbon black, a tellurium dye, an oxonol dye, a thiopyrilium dye, a cyanine dye or a squarilium dye.

13. The element of claim 10 wherein said support is a polyester film or a sheet of grained and anodized aluminum.

14. The element of claim 10 in which the o-diazonaphthoquinone derivative is a sulfonic acid or a carboxylic acid ester of an o-diazonaphthoquinone, and the phenolic resin is a novolac resin.

15. The element of claim 14 wherein said o-diazonaphthoquinone derivative is 2,4-bis(2-diazo-1,2-dihydro-1-oxo-5-naphthalenesulfonyloxy)benzophenone, 2-diazo-1,2-dihydro-1-oxo-5-naphthalenesulfonyloxy-2,2-bis(hydroxyphenyl)propane monoester, the hexahydroxybenzophenone hexaester of 2-diazo-1,2-dihydro-1-oxo-5-naphthalenesulfonic acid, 2,2'-bis(2-diazo-1,2-dihydro-1-oxo-5-naphthalenesulfonyloxy)biphenyl, 2,2',4,4'-tetrakis(2-diazo-1,2-dihydro-1-oxo-5-naphthalenesulfonyloxy)biphenyl, 2,3,4-tris(2-diazo-1,2-dihydro-1-oxo-5-naphthalenesulfonyloxy)benzophenone, 2,4-bis(2-diazo-1,2-dihydro-1-oxo-4-naphthalenesulfonyloxy)benzophenone, 2-diazo-1,2-dihydro-1-oxo-4-naphthalenesulfonyloxy-2,2-bis(hydroxyphenyl)propane monoester, the hexahydroxybenzophenone hexaester of 2-diazo-1,2-dihydro-1-oxo-4- naphthalenesulfonic acid, 2,2'-bis(2-diazo-1,2-dihydro-1-oxo-4-naphthalenesulfonyloxy)biphenyl, 2,2',4,4'-tetrakis(2-diazo-1,2-dihydro-1-oxo-4-naphthalenesulfonyloxy)biphenyl or 2,3,4-tris(2-diazo-1,2-dihydro-1-oxo-4-naphthalenesulfonyloxy)benzophenone, and said infrared radiation absorbing compound is carbon black.

16. The element of claim 10 wherein the weight ratio of infrared radiation absorbing material to the diazonaphthoquinone moiety of a) is from about 1:0.5 to about 1:50.

17. The composition of claim 1 in which the composition contains at least about 1 weight percent of non-photosensitive dissolution inhibitor compound, based on the total dry composition weight.

18. The composition of claim 17 in which the non-photosensitive dissolution inhibitor compound is selected from the group consisting of xanthone; flavanone; flavone; 2,3-diphenyl-1-indenone; 1'-(2'-acetonaphthonyl)benzoate; α-naphthoflavone; β-naphthoflavone; 2,6-diphenyl-4H-pyran-4H-one; and 2,6-diphenyl-4H-thiopyran-4H-one.

19. The element of claim 10 in which the composition contains at least about 1 weight percent of non-photosensitive dissolution inhibitor compound, based on the total dry composition weight.

20. The element of claim 19 in which the non-photosensitive dissolution inhibitor compound is selected from the group consisting of xanthone; flavanone; flavone; 2,3-diphenyl-1-indenone; 1'-(2'-acetonaphthonyl)benzoate; α-naphthoflavone; β-naphthoflavone; 2,6-diphenyl-4H-pyran-4H-one; and 2,6-diphenyl-4H-thiopyran-4H-one.

21. The composition of claim 17 in which the non-photosensitive dissolution inhibitor compound is an aromatic ketone.

22. The element of claim 19 in which the non-photosensitive dissolution inhibitor compound is an aromatic ketone.

23. The composition of claim 21 in which component a) comprises component (ii), and the o-diazonaphthoquinone reactive derivative is a sulfonic acid or a carboxylic acid ester of a o-diazonaphthoquinone, and the phenolic resin is a novolac resin.

24. The composition of claim 21 in which component a) comprises component (i), and the phenolic resin is a novolac resin.

25. The composition claim 21 in which the weight ratio of the infrared absorbing material to the o-diazonaphthoquinone moiety of component a) is from about 1:0.5 to about 1:50.

* * * * *